United States Patent [19]

Yamada

[11] 4,373,167
[45] Feb. 8, 1983

[54] SOLID STATE IMAGE SENSOR WITH OVERFLOW PROTECTION AND HIGH RESOLUTION

[75] Inventor: Tetsuo Yamada, Yokohama, Japan

[73] Assignee: Tokyo Shibaura Denki Kabushiki Kaisha, Kawasaki, Japan

[21] Appl. No.: 195,614

[22] Filed: Oct. 9, 1980

Related U.S. Application Data

[63] Continuation of Ser. No. 2,001, Jan. 9, 1979, abandoned.

[30] Foreign Application Priority Data

Jan. 13, 1978 [JP] Japan .................................. 53-1971

[51] Int. Cl.³ .................... H01L 29/78; H01L 27/14; H01L 31/00
[52] U.S. Cl. ........................................ 357/24; 357/30
[58] Field of Search ........................... 357/24 LR, 30

[56] References Cited

U.S. PATENT DOCUMENTS

| 3,845,295 | 10/1974 | Williams et al. | 357/24 LR |
| 3,866,067 | 2/1975 | Amelio | 357/24 LR |
| 3,896,474 | 7/1975 | Amelio et al. | 357/24 LR |
| 3,896,485 | 7/1975 | Early | 357/24 LR |

*Primary Examiner*—Gene M. Munson
*Attorney, Agent, or Firm*—Oblon, Fisher, Spivak, McClelland & Maier

[57] ABSTRACT

A plurality of photoelectric conversion elements are arranged on a semiconductor substrate and a reverse bias voltage is supplied between the photoelectric conversion elements and the substrate. The excess signal carriers generated at the photoelectric conversion elements flow into the substrate which serves as a drain region to prevent the blooming phenomenon.

3 Claims, 13 Drawing Figures

SOLID STATE IMAGE SENSOR WITH OVERFLOW PROTECTION AND HIGH RESOLUTION

This is a continuation of application Ser. No. 002,001, filed on Jan. 9, 1979, now abandoned.

BACKGROUND OF THE INVENTION

1. Field of the Invention

This invention relates to a solid state image sensor comprising a plurality of photoelectric conversion elements formed in a semiconductor substrate, and more particularly to a drain region for preventing a blooming phenomenon.

2. Description of the Prior Art

In general, in a solid state image sensor, signal carriers are stored in a plurality of photoelectric conversion elements on a semiconductor substrate according to optical information, and are read out by means of a charge coupled device (C.C.D.). In the case where the quantity of light incident on the photoelectric conversion element in a predetermined period of time is considerably great, carriers are produced in the phototlectric conversion element in excess of the maximum storage capacity, and accordingly the excess carriers are caused to flow into the adjacent photoelectric conversion element over a channel stop region which isolates the photoelectric conversion elements from one another. This is a so-called blooming phenomenon. There has been a strong demand for preventing the blooming phenomenon.

Heretofore, a method is employed to prevent the blooming phenomenon, in which a blooming phenomenon preventing drain is formed in contact with the channel stop region in the vicinity of the surface of the substrate, and a bias voltage is applied to the region, so that the excessive carriers are allowed to flow to the drain region. It is true that the blooming phenomenon can be prevented by this method. However, this method is disadvantageous in that the effective area of the photoelectric conversion element is reduced as much as the blooming phenomenon preventing drain is formed, and the effective sensitivity of the solid state image sensor is lowered. In addition, the method is disadvantageous in increasing the density of integrated circuits forming the solid state image sensor.

SUMMARY OF THE INVENTION

It is therefore an object of the present invention to provide a solid state image sensor which can prevent a blooming phenomenon without the decrease of effective sensing area.

Briefly, according to this invention there is provided a solid state image sensor which comprises: (a) a semiconductor substrate having a main surface, (b) a plurality of photoelectric conversion elements formed on the main surface of the substrate, (c) means for reading out signal carriers charged at photoelectric conversion elements, (d) a drain region for preventing the blooming phenomenon, and (e) means for biasing the drain region, said drain region being disposed beneath the image sensor elements.

BRIEF DESCRIPTION OF THE DRAWINGS

The invention is illustrated by way of example in the accompanying drawings which form part of this application and in which.

DESCRIPTION OF THE PREFERRED EMBODIMENTS

Figure 1A:
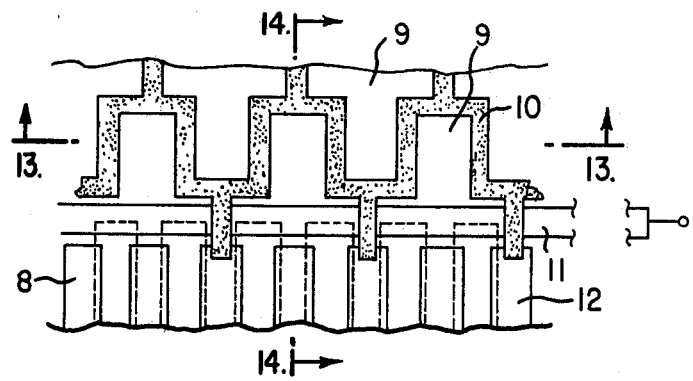
FIG. 1A is a plan view of a first embodiment of the present invention.
Figure 1B:
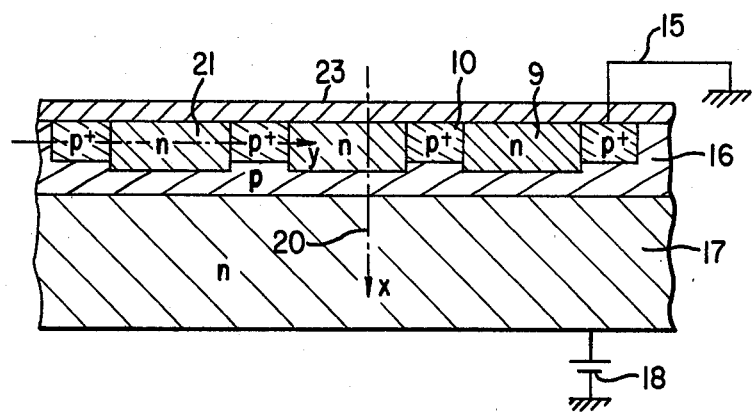
FIG. 1B is a cross-sectional view taken along line 13—13 in FIG. 1A.
Figure 1C:
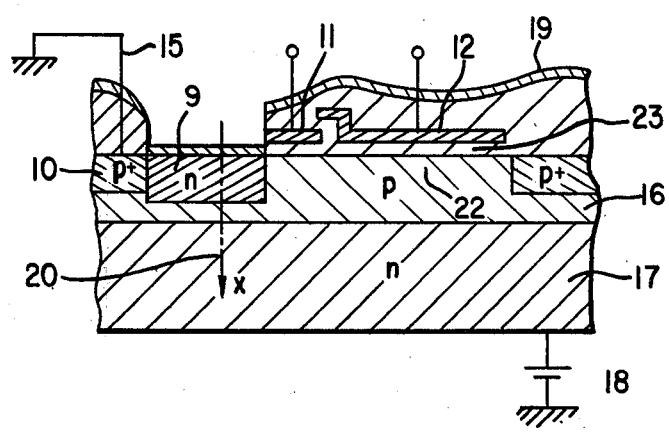
FIG. 1C is a cross-sectional view taken along line 14—14 in FIG. 1A.

Referring now to the drawings, wherein like reference numerals designate identical or corresponding parts throughout the several views, FIGS. 1A through 1C illustrate a first embodiment of the invention, in which PN junction elements are employed as photoelectric conversion elements. Each PN junction element is constituted by an N type region 9 and P type layer 16. The photoelectric conversion elements are isolated from one another by P+ type channel stops 10. The surface of the elements is covered with an insulating film 23. The Channel stop regions 10 are biased to a reference potential by means of an electrode 15. In this embodiment, a signal carrier stored in the N type regions 9 is read out by using a charge coupled device (C. C. D.) The signal carrier stored is shifted to a transfer medium 8, or the CCD, by means of a shift gate 11, and it is further transferred in a direction perpendicular to the surface of the drawing of FIG. 1C by means of a transfer electrode 12 to which clock pulses are successively applied. Simultaneously when a high voltage is applied to the transfer electrode 12, the surface potential of a surface channel 22 is increased, and a depletion layer is formed therein. If, under this condition, a positive voltage is applied to the shift gate 11, the potential of the surface of the P type layer 16, which confronts the shift gate 11 is increased, and the signal carrier in the N type region 9 forming the photoelectric conversion element is moved to the transfer channel region 22 according to the potential below the shift gate 11.

Thereafter, the shift gate 11 is set to a substantially zero potential by grounding it, whereby a state that the storage of the signal carrier subjected to photoelectric conversion is started again is obtained. Thus, the image sensing operation is carried out by repeatedly reading out the carrier stored in the N type region 9 for a predetermined period of time as described above. In FIG. 1C, reference numeral 19 designates an optical shield layer.

The P type layer 16 forming one of the P-N junction type photoelectric conversion elements forms a second P-N junction with a N type substrate 17. The channel stop regions 10 formed by the P+ type layer are maintained at a zero potential by means of an electrode 15. Under this condition, the P type layer 16 is at the reference potential. However, if the substrate 17 is biased above a predetermined potential by an electric source 18, a punch-through condition is obtained in which the P type layer 16 between the N type regions 9 and the N type substrate 17 is in depletion conditon. Under this condition, the potential of the P type layer 16 existing as a signal carrier barrier between the N type regions 9 and the substrate 17, being separated from the reference potential, is set to a positive potential; that is, the barrier is lowered for the signal carrier, or electrons. If, in this case, the P+ channel stop regions 10 are still at the reference potential (zero potential), the excess signal carriers are allowed to flow into the N type silicon substrate 17 without going over the barrier formed by the channel stops layer 10.

The above-described principle will be further described with reference to FIGS. 2A, 2B, 3A, and 3B in more detail.

Figure 2A:
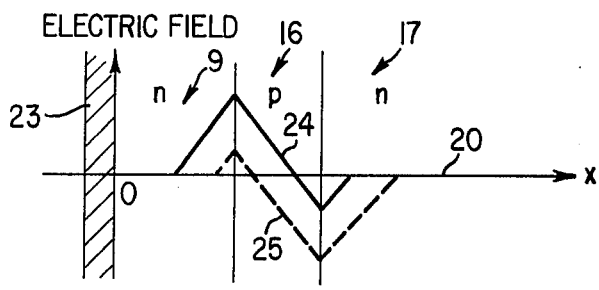
FIG. 2A is an electric field distribution diagram taken along line 20 in FIGS. 1B and 1C.
Figure 2B:
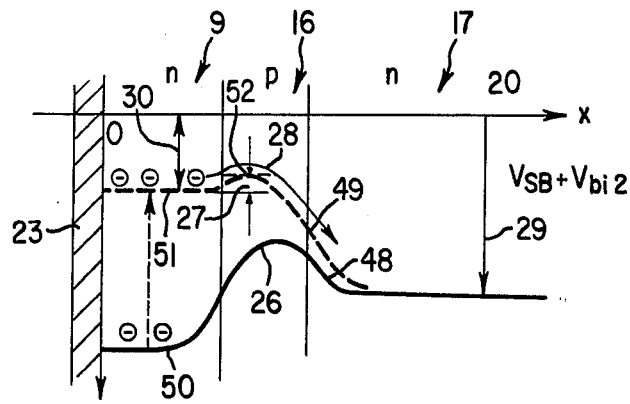
FIG. 2B is an electric potential distribution diagram taken along line 20 in FIGS., 1B and 1C.

In these figures, those components which have been previously described with reference to FIGS. 1A through 1C have therefore been similarly numbered. In FIG. 2A, reference numeral 24 designates an electric field distribution in which a small amount of signal carriers are stored in the N type region 9 forming one of the P-N junction type photoelectric conversion elements, and reference numeral 25 designates an electric field distribution in which the excess signal carriers overflow from the N type region 9 to the N type substrate 17. A potential distribution corresponding to FIG. 2A is shown in FIG. 2B, in which reference numeral 48 designates a potential distribution (indicated by the solid line) obtained in the case where a small amount of signal carriers exist, and reference numeral 49 designates a potential distribution (indicated by the broken line) obtained in the case where the excess carriers flow to the N type substrate 17. In the figure, potentials are plotted on the vertical axis, and the potential is increased to a positive value as it goes downward along the vertical axis. Furthermore, reference numeral 50 designates the maximum potential of the N type region 9 including the small amount of signal carriers; reference numeral 26, the barrier potential of the P type layer 16; reference numeral 51, the maximum potential of the N type region 9 under the condition that the flow of the excessive carriers occurs; reference numeral 52, the corresponding barrier potential; and reference numeral 29, the substrate potential obtained when a positive bias voltage is applied to the N type substrate 17 by the electric source 18.

If the impurity density of the N type substrate 17 is represented by $N_{D1}$; the P type impurity density, $N_A$; the impurity density of the N type impurity regions 9, $N_{D2}$; and the bias voltage 18 to the substrate, $V_{SB}$, then the potential 29 of the substrate 17 can be expressed by the following formula:

$$V_{SB} + V_{bi2} \text{ where } V_{bi2} = \frac{KT}{q} n \ln \frac{N_{D1}N_A}{(ni)^2},$$

k is the Boltzmann's constant, T is the absolute temperature, and ni is intrinstic carrier density, q is electric charge.

In this case, the minimum barrier potential of the P type impurity layer 16 is made to be higher than the reference potential, or the potential of the P+ channel stops, by the bias voltage $V_{SB}$. On the other hand, when the potential difference 27 between the maximum potential 51 of the N type regions 9 filled with the signal carriers (which are electrons in this case) and the minimum potential 52 of the P type layer 16 becomes lower than the built-in potential of the P type regions 16 and the N type layer 9, the signal carriers are allowed to go over the barrier 52 and to flow to the N type substrate 17. In this case, the value $V_{bi1}$ can be expressed by the following equation:

$$V_{bi1} = \frac{KT}{q} n \ln \frac{N_{D2}N_A}{(ni)^2}$$

If the barrier potential of the P type layer 16 with respect to the reference voltage is represented by $V_B$ and the maximum potential of the N type region 9 is represented by $V_M$, then the condition that the above-described signal carriers flow to the substrate 17 can be analyzed as follows:

$$V_M - V_B \leq \frac{KT}{q} \ln \frac{N_{D2}N_A}{(ni)^2}$$

$$V_M = V_B + \frac{qN_{D2}}{2\epsilon_s}\left(1 + \frac{N_{D2}}{N_A}\right)\left(X_J - \frac{Q_{sig}}{N_{D2} \cdot q}\right)^2$$

$$V_B = V_{SB} + V_{bi2} -$$

$$\frac{N_A}{2\epsilon_s}\left(1 + \frac{N_A}{N_{D1}}\right)\left\{X_B - \frac{N_{D2}}{N_{D1}}\left(X_J - \frac{Q_{sig}}{N_{D2} \cdot q}\right)\right\}^2$$

where $\epsilon_s$ is the dielectric constant of silicon $X_J$ is the depth of the N type layer ($X_B$ is the thickness of the P type layer 16, and Qsig is the quantity of charge of the carriers existing in the N type layer 9 per unitary area.

Figure 3A:
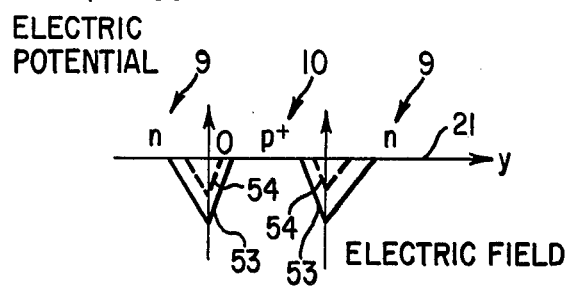
FIG. 3A is an electric field distribution diagram taken along line 21 in FIG. 1B.
Figure 3B:
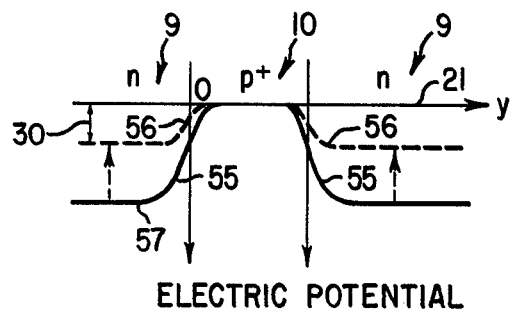
FIG. 3B is an electric potential distribution diagram taken along line 21 in FIG. 1B.

If $N_{D1} \simeq N_{D2} \simeq 10^{16}/cm^3$, $N_A \simeq 10^{16}/cm^3$, $X_J = 1$ μm, and $X_B \simeq 0.8$ μm, then N, type substrate 17 can satisfy the condition of a blooming preventing drain with $V_{SB} = 5$ V or higher. As for the P+channel stops, under the above-described condition, the barrier potential must be equal to the reference potential or closer to the reference potential than the value 52. This condition can be readily realized as shown in FIGS. 3A and 3B. In FIG. 3A, the solid line 52 indicates an electric field distribution obtained in the case where a small amount of signal charges exist in the N type regions 9, and the broken line 54 indicates an electric field distribution surrounding the P+ channel stops 10 under the condition that the signal carriers flow form the N type layer 9 to the N type substrate 17. FIG. 3B shows a potential distribution corresponding to the electric field distribution shown in FIG. 3A. In FIG. 3B, the solid line 55 shows a potential distribution of the N type regions 9 and the P+ channel stops 10 in the case where a small amount of signal carriers exist, and the broken line 56 indicates a potential distribution of the N type regions 9 and the P+ channel stops 10 under the condition that the signal carriers flow to the N type substrate 17. In this example, the P+ channel stops 10 are not in the punch-through condition, and a large part thereof is filled with holes, or majority carriers, being at the reference potential at all times. Accordingly, the barrier potential difference obtained from the potential difference between the maximum potential of the N type regions 9 and the potential of the P+ channel stops 10 is higher than the barrier potential difference 27 in FIG. 2B at all times, and therefore the signal carriers never flow out over the P+ channel stops 10. That is, no blooming phenomenon is caused. In this example, the P+ channel stops 10 has a length of −5 μm in the direction Y, and an impurity density of −10$^{18}$/cm$^3$.

The structure shown in the example can be readily obtained by forming the P type layer 16 on the N type substrate by epitaxial growth and by forming the N type regions 9 and the P+ channel stops 10 by ion implantation.

A second embodiment of this invention will be described with reference to FIGS. 4A throught 4C. In this case, the operating principle of a solid state image sensor according to the second embodiment is similar to that of the embodiment shown in FIG. 1A; however, it should be noted that the specific feature of the second embodiment resides in that MOS varactors are employed as photoelectric conversion elements.

Figure 4A:
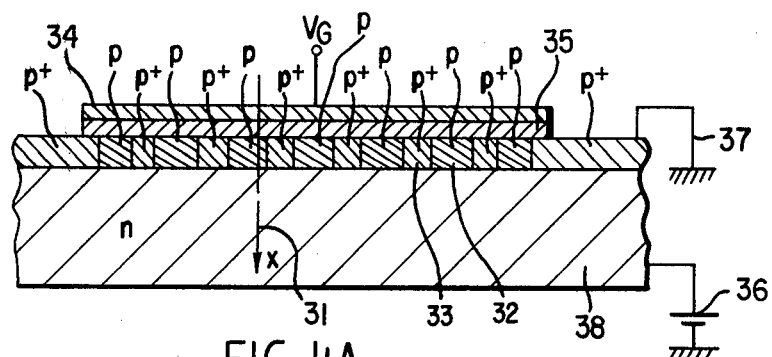
FIG. 4A is a cross-sectional view of a second embodiment of the present invention.

In FIG. 4A, the MOS varactors are constituted by a transparent electrode 34, an insulating film 35 of, for instance, SiC$_2$, and P type regions 32. The MOS varactors are isolated from one another by P+ channel stop regions 33 which are maintained at a reference potantial by means of an electrode 37. A reverse bias is applied to a substrate 38 by an electric source 36.

The blooming phenomenon preventing operation of the second embodiment thus constructed will be described.

Figure 4B:
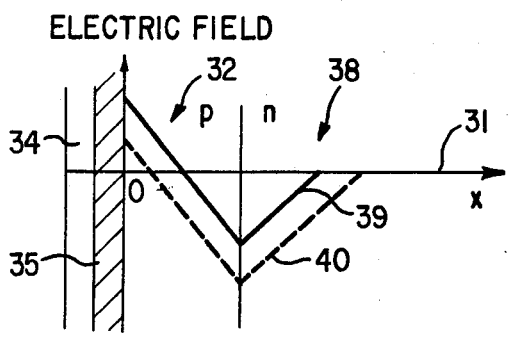
FIG. 4B is an electric field distribution diagram taken along line 31 FIG. 4A.
Figure 4C:
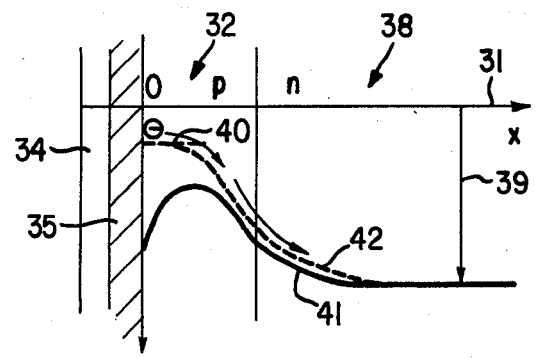
FIG. 4C is an electric potential distribution diagram taken along line 31 in FIG. 4A.

FIG. 4B shows an electric field which is created in the direction X in FIG. 4A. In this case, the transparent electrode 34 is applied with a positive voltage VG. In the MOS varactor, as well known in the art, a depletion layer is formed in the surface of the P type regions 32 by applying a positive voltage to the transparent electrode 34 which is the gate electrode, and electrons, which are signal carriers provided by light applied through the layers 34 and 35 to the P type layer 32, are stored in the interface between the insulating layer 35 and the P type regions 32. In FIG. 4B, the solid line 39 indicates an electric field distribution in the case where the aforementioned small number of signal carriers are stored in the surface of the P type regions 32, and the broken line 40 indicates an electric field distribution in the case where the signal carriers are stored sufficiently to flow out of the surface of the P type regions 32, and the broken line 40 indicates an electric field distribution in the case where the signal carriers are stored sufficiently to flow out of the surface of the P type regions 32. As is apparent from FIG. 4B, a bias voltage 36 is so sufficiently applied to the substrate 38 that a punch-through state is formed from the P type regions 32 to the N type substrate 38. FIG. 4C shows potential distributions along the direction X (or 31). In FIG. 4C, the solid line 41 indicates a potential distribution in the case where a small number of signal carriers exist, and the broken line 42 indicates a potential distribution in the case where the number of signal carriers stored in the surface of the P type regions 32 is so large as to flow out to the N type substrate 32. According to the principle similar to that of the blooming phenomenon preventing method described with reference to FIGS. 1A and 4A, a punch-through state is formed from the P type regions 32 to the N type substrate 38 by sufficiently increasing the reverse bias voltage 36 to be applied to the N type substrate 38, whereby the minimum potential in the P type layer which will become a barrier when the signal charges flow to the substrate can be set to a potential more positive than the reference potential. Accordingly, the signal carriers never go over the P+ channel stop regions 33; that is, no blooming phenomenon is caused, and the excessive carriers are allowed to flow to the N type substrate 38. Thus, in the second embodiment also, the substrate 38 can satisfy the condition of blooming pehnomenon preventing drain.

Figure 5A:
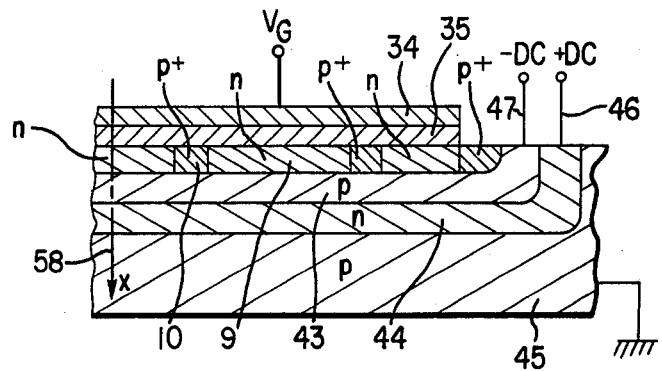
FIG. 5A is a cross-sectional view of a third embodiment of the present invention.

A third embodiment of this invention will be described with reference to FIGS. 5A through 5C. In this embodiment, photoelectric conversion elements are provided by P-N junction elements which are formed by N type regions 9 and P type layer 43. The photoelectric conversion elements are isolated from one another by P+ channel stop regions 10. In this embodiment, a P type substrate 45 is employed, and an N type buried layer 44 serving as blooming phenomenon preventing drain is formed in the substrate. The P type substrate 45 is maintained at a reference potential. A positive bias voltage is applied to the N type buried layer 44 through an electrode 46. A reference voltage or a negative bias voltage is applied to the P type layers 43. A transparent electrode 34 is formed on an insulating film 35 which covers the surface of the substrate (in this connection, it should be noted that the provision of the transparent electrode 34 is not always required). The specific feature of the third embodiment resides in that the blooming phenomenon preventing drain is provided by the buried layer 44 instead of the substrate.

Figure 5B:
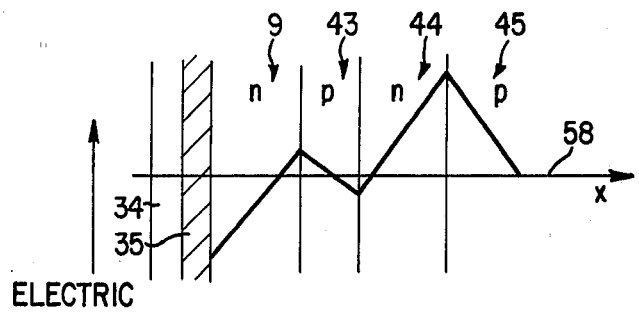
FIG. 5B is an electric filed distribution diagram taken along line 58 in FIG. 5A.
Figure 5C:
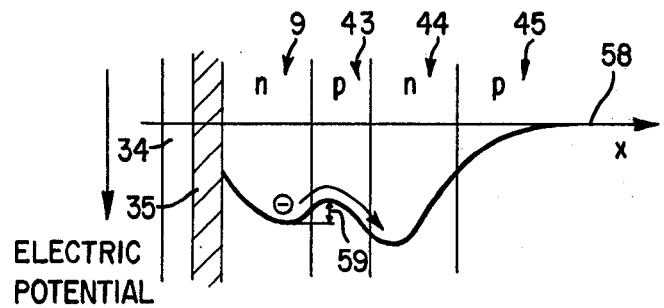
FIG. 5C is an electric potential distribution diagram taken along line 58 in FIG. 5A.

FIGS. 5B and 5C show an electric field distribution in the direction X and a potential distribution in the same direction, respectively. As is apparent from FIG. 5C, similarly as in the first embodiment, the N type layers 9 and the blooming phenomenon preventing buried layer drain 44 are placed in a punch-through state with the aid of the P type layer 43 which has been completely depleted by a reverse bias voltage applied to the electrodes 46 and 47, the barrier potential difference 59 of the P type layer 32 and the N type layer is decreased, and the barrier potential difference becomes lower than the diffusion potential difference as the number of signal carriers in the N type layer increases, whereupon the excess carriers are allowed to flow to the N type buried layer 44 which is the blooming phenomenon preventing drain. On the other hand, as the P+ channel stop regions are maintained at a negative voltage or at the reference voltage, no blooming phenomenon is caused. The detail of the principle of the third embodiment is similar to that of the first embodiment.

While the invention has been described with reference to its three preferred embodiments; the invention is not limited thereto or thereby. For instance, the invention can be realized by reversing the use of N type impurity layers and P type impurity layers and by reversely applying the bias voltage. Furthermore, the signal reading method and the signal storing method of the solid state image sensor are not limited to those of the embodiments described above. This invention can be applied to both of the one dimensional and two dimensional solid state image sensors.

The conventional blooming phenomenon preventing method causes the loss in effective area of the solid state image sensor. However, as is apparent from the above description, the application of this invention provides effective blooming phenomenon prevention without causing loss in effective area at all. Furthermore, the additional effect of the invention is that the unwanted signal carriers due to long wavelength light, especially infrared rays, which are generated in the substrate, causing crosstalk between the photoelectric conversion elements to lower the resolution are not allowed to flow to the photoelectric conversion elements and are absorbed by the blooming phenomenon preventing drain, which leads to an improvement of the resolution of the solid state image sensor.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A solid state image sensor comprising:
   (a) a first conductivity type semiconductor substrate having first and second main surfaces;
   (b) a second conductivity type semiconductor layer on the first main surface of the semiconductor substrate, which forms a first P-N junction therebetween wherein the first conductivity type semiconductor substrate and the second conductivity type semiconductor layer each extend over an area including at least the entire area of said image sensor;
   (c) a first conductivity type region within the second conductivity type semiconductor layer, which forms a second P-N junction therebetween and serves as a photoelectric conversion element formed of a photodiode in conjunction with the second conductivity type semiconductor layer;
   (d) means for reading out signal carriers generated in the photoelectric conversion element including a gate electrode, a transfer electrode and a channel region, said channel region being formed within the second conductivity type semiconductor layer and beneath the gate electrode, wherein signal carriers are transferred from said photoelectric conversion element of the first conductivity region into the channel region under control of said gate electrode and said transfer electrode;
   (e) biasing means for supplying a reverse bias voltage to the first P-N junction, which causes the second conductivity type semiconductor layer to be kept in the punch-through condition, said biasing means being connected to the second main surface of the semiconductor substrate;
   (f) wherein the first conductivity type region is surrounded by a channel stop region;
   said substrate having a first drain region beneath the photoelectric conversion element for preventing a blooming phenomenon and the excess signal carriers generated at the second P-N junction flowing into the substrate, and a second drain region beneath the means for reading out signal carriers for trapping unwanted carriers generated at the substrate due to long wave length light.

2. The solid state image sensor according to claim 1, wherein the means for reading out the signal carriers is a charge coupled device (C.C.D.).

3. The solid state image sensor according to claim 1, wherein the first and second conductivity types are respectively P and N conductivity types.

* * * * *